United States Patent
Tseng et al.

(10) Patent No.: US 12,183,422 B2
(45) Date of Patent: Dec. 31, 2024

(54) MEMORY DEVICE AND IN-MEMORY SEARCH METHOD THEREOF

(71) Applicant: MACRONIX International Co., Ltd., Hsinchu (TW)

(72) Inventors: Po-Hao Tseng, Taichung (TW); Feng-Min Lee, Hsinchu (TW); Tian-Cih Bo, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 192 days.

(21) Appl. No.: 18/166,495

(22) Filed: Feb. 9, 2023

(65) Prior Publication Data

US 2024/0274164 A1 Aug. 15, 2024

(51) Int. Cl.
G11C 7/10 (2006.01)
G11C 8/08 (2006.01)

(52) U.S. Cl.
CPC .............. *G11C 7/1069* (2013.01); *G11C 8/08* (2013.01)

(58) Field of Classification Search
CPC ........ G11C 7/1069; G11C 8/08; G11C 15/046
USPC .................................................. 365/189.011
See application file for complete search history.

(56) References Cited

U.S. PATENT DOCUMENTS

| | | | |
|---|---|---|---|
| 9,620,214 B2 | 4/2017 | Watanabe et al. | |
| 11,631,467 B2* | 4/2023 | Lee ...................... | G11C 29/021 |
| | | | 365/189.011 |
| 2008/0205119 A1* | 8/2008 | Nagai ...................... | G11C 11/16 |
| | | | 365/189.09 |
| 2009/0141531 A1 | 6/2009 | Abedin et al. | |
| 2010/0182833 A1* | 7/2010 | Chen ..................... | G11C 29/021 |
| | | | 365/210.1 |
| 2020/0294560 A1* | 9/2020 | Wang ...................... | G11C 8/10 |
| 2023/0036141 A1 | 2/2023 | Tseng et al. | |
| 2024/0201853 A1* | 6/2024 | Feng ...................... | G11C 16/34 |

FOREIGN PATENT DOCUMENTS

| | | | | |
|---|---|---|---|---|
| CN | 115641893 A | * | 1/2023 | .......... G11C 15/046 |
| JP | 4892720 | | 3/2012 | |
| TW | I485710 | | 5/2015 | |

OTHER PUBLICATIONS

Zeng (Year: 2023).*
Po-Hao Tseng et al., "In-Memory-Searching Architecture Based on 3D-NAND Technology with Ultra-high Parallelism," 2020 IEEE International Electron Devices Meeting (IEDM), Dec. 2020, pp. 1-4.
Po-Hao Tseng et al., "A Hybrid In-Memory-Searching and In-Memory-Computing Architecture for NVM Based AI Acce lerator," 2021 Symposium on VLSI Technology, Jun. 2021, pp. 1-2.

* cited by examiner

*Primary Examiner* — Fernando Hidalgo
(74) *Attorney, Agent, or Firm* — J.C. PATENTS

(57) ABSTRACT

A memory device and an in-memory search method thereof are provided. The in-memory search method includes: providing, in a first stage, a first voltage or a second voltage to a word line of at least one target memory cell according to a logical status of searched data, and reading a first current; providing, in a second stage, a third voltage or a fourth voltage to the word line of the at least one target memory cell according to the logical status of the searched data, and reading a second current; and obtaining a search result according to a difference between the second current and the first current.

17 Claims, 9 Drawing Sheets

MEMORY DEVICE AND IN-MEMORY SEARCH METHOD THEREOF

BACKGROUND

Technical Field

The disclosure relates to a memory device and an in-memory search method thereof, and in particular to a memory device without reference memory cells and an in-memory search method thereof.

Description of Related Art

With the rise of big data and artificial intelligence hardware accelerators, data comparison/search has become an indispensable function. In the prior art, the so-called ternary content addressable memory (TCAM) can implement a high degree of parallel data search. The ternary content addressable memory in the prior art is usually composed of a static memory, so there are often the issues of insufficient storage density and high power consumption.

Correspondingly, the prior art proposes to implement the ternary content addressable memory by using a non-volatile memory. However, in the prior art, a non-volatile memory cell is always required to store data, and another non-volatile memory cell is used as a reference memory cell to complete the search operation of one bit of data. As a result, the memory device requires a relatively large circuit area, which causes waste.

SUMMARY

The disclosure provides a memory device and an in-memory search method thereof, which perform a data search operation in a memory through a two-stage manner.

An in-memory search method of the disclosure includes the following steps. In a first stage, a first voltage or a second voltage is provided to a word line of at least one target memory cell according to a logic status of searched data, and a first current is read. In a second stage, a third voltage or a fourth voltage is provided to the word line of the at least one target memory cell according to the logic status of the searched data, and a second current is read. A search result is obtained according to a difference between the first current and the second current. The first voltage is less than the third voltage, the third voltage is less than or equal to the second voltage, and the second voltage is less than the fourth voltage.

A memory device of the disclosure includes a memory cell array and a controller. The controller is coupled to the memory cell array. The controller is used to execute the following steps. In a first stage, a first voltage or a second voltage is provided to a word line of at least one target memory cell according to a logic status of searched data, and a first current is read. In a second stage, a third voltage or a fourth voltage is provided to the word line of the at least one target memory cell according to the logic status of the searched data, and a second current is read. A search result is obtained according to a difference between the first current and the second current. The first voltage is less than the third voltage, the third voltage is less than or equal to the second voltage, and the second voltage is less than the fourth voltage.

Based on the above, the disclosure can complete the in-memory search operation without a reference memory cell by using a single non-volatile memory cell through the two-stage manner, so as to effectively increase the utilization rate of the memory cell, increase the search capacity in the memory, and reduce the circuit area required by the memory device.

DETAILED DESCRIPTION OF DISCLOSED EMBODIMENTS

Figure 1:
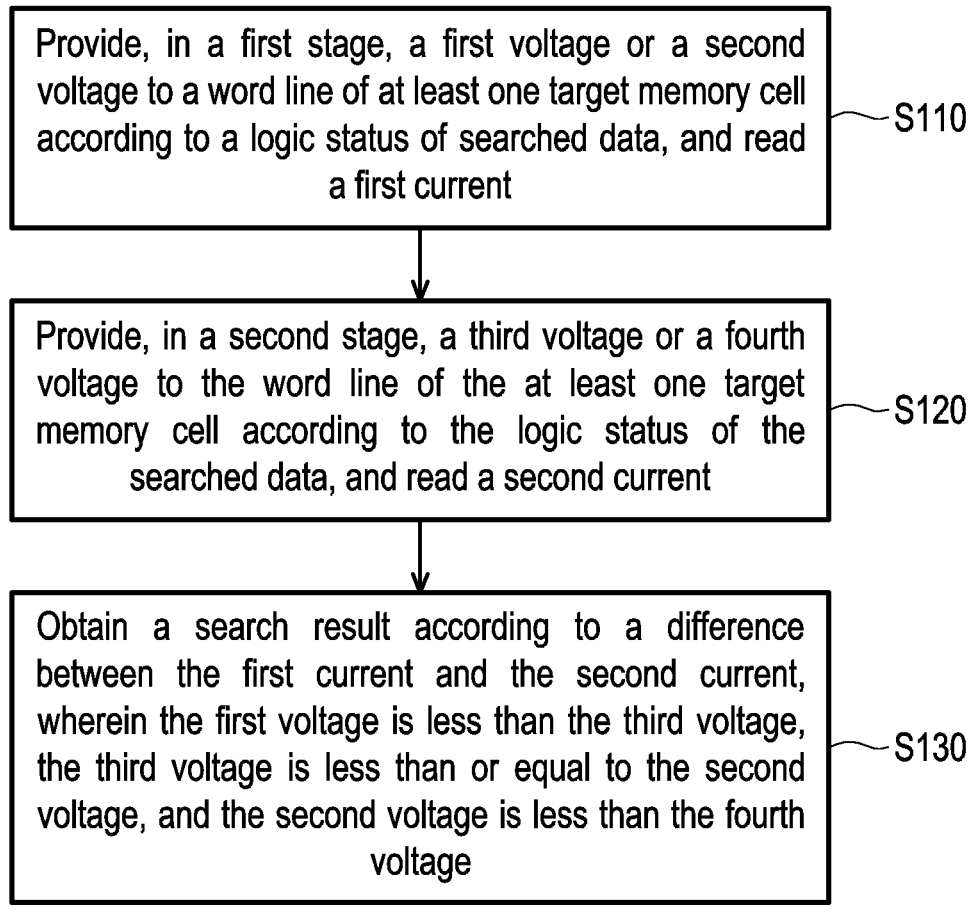
FIG. 1 is a flowchart of an in-memory search method according to an embodiment of the disclosure.
Figure 2:
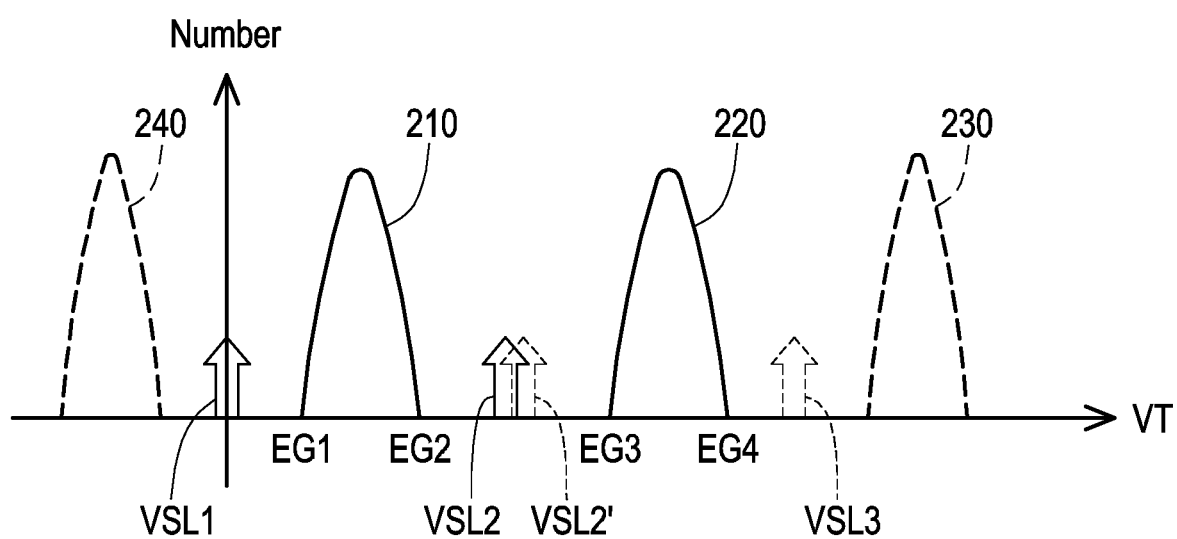
FIG. 2 is a schematic diagram of an operation of an in-memory search method according to the embodiment of the disclosure.

Please refer to FIG. 1 and FIG. 2 synchronously. FIG. 1 is a flowchart of an in-memory search method according to an embodiment of the disclosure. FIG. 2 is a schematic diagram of an operation of an in-memory search method according to the embodiment of the disclosure. The vertical axis of FIG. 2 is the number of memory cells, and the horizontal axis is a threshold voltage VT of the memory cells. Distribution curves 210 to 240 are respectively distribution ranges of the threshold voltages of the memory cells having different storage data. The distribution curve 210 is, for example, the distribution range of the threshold voltage of the memory cell whose storage data is logic 0; the distribution curve 220 is, for example, the distribution range of the threshold voltage of the memory cell whose storage data is logic 1; and the distribution curves 230 and 240 are both the distribution ranges of the threshold voltages of the memory cells storing invalid data. In the embodiment, the distribution curve 210 has a lower edge EG1 and an upper edge EG2, wherein the lower edge EG1 is less than the upper edge EG2. The distribution curve 220 has a lower edge EG3 and an upper edge EG4, wherein the lower edge EG3 is less than the upper edge EG4, and the lower edge EG3 is greater than the upper edge EG2.

Please refer to FIG. 1. The steps in FIG. 1 may be executed through a controller in a memory device. In Step S110, in a first stage, the controller may provide a first voltage VSL1 or a second voltage VSL2 to a word line of at least one target memory cell according to a logic status of searched data, and read a first current. As shown in FIG. 2, the first voltage VSL1 is less than the lower edge EG1, and the second voltage VSL2 is greater than the upper edge EG2.

In Step S120, in a second stage, the controller may provide a third voltage VSL2' or a fourth voltage VSL4 to the word line of the at least one target memory cell according to the logic status of the searched data, and read a second current. As shown in FIG. 2, the third voltage VSL2' is greater than or equal to the second voltage VSL2, and the third voltage VSL2' is greater than the upper edge EG2 and is less than the lower edge EG3. The fourth voltage VSL3 is greater than the upper edge EG4.

Next, in Step S130, the controller may subtract the first current from the second current, and generate a search result according to whether the difference between the second current and the first current is greater than a preset current threshold. In the embodiment, when the difference between the second current and the first current is greater than a preset current, the controller may generate the search result of match. On the contrary, if the difference between the second current and the first current is not greater than the preset current and approaches 0, the controller may generate the search result of un-match.

To further explain, when the logic status of the searched data is logic 0, in the first stage (Step S110), the controller may provide the relatively low first voltage VSL1 to the word line of the target memory cell for the search operation, and execute a read operation for the target memory cell to obtain the first current. Based on the first voltage VSL1 being lower than the lower edge EG1, regardless of whether the data stored in the target memory cell is logic 0 or logic 1, the first current obtained by executing the read operation for the target memory cell approaches 0.

Then, in the second stage (Step S120), the controller may provide the third voltage VSL2' to the word line of the target memory cell for the search operation, and execute the read operation for the target memory cell to obtain the second current. Based on the third voltage VSL2' being higher than the upper edge EG2, but lower than the lower edge EG3, when the data stored in the target memory cell is logic 0, the second current may be a reference current value greater than 0, and when the data stored in the target memory cell is logic 1, the second current may approach 0.

Therefore, when the logic status of the searched data is logic 0 and the data stored in the target memory cell is logic 0, the controller may calculate that the difference between the second current and the first current is equal to the reference current value (greater than the preset current threshold), and may correspondingly generate the search result of match. In contrast, when the logic status of the searched data is logic 0 and the data stored in the target memory cell is logic 1, the controller may calculate that the difference between the second current and the first current approaches 0 (less than the preset current threshold), and may correspondingly generate the search result of un-match.

On the other hand, when the logic status of the searched data is logic 1, in the first stage (Step S110), the controller may provide the second voltage VSL2 to the word line of the target memory cell for the search operation, and execute the read operation for the target memory cell to obtain the first current. Based on the second voltage VSL2 being between the upper edge EG2 and the lower edge EG3, if the data stored in the target memory cell is logic 0, the first current obtained by executing the read operation for the target memory cell may be the reference current value greater than 0. On the other hand, if the data stored in the target memory cell is logic 1, the first current obtained by executing the read operation for the target memory cell may approach 0.

Then, when the logic status of the searched data is logic 1, in the second stage (Step S120), the controller may provide the fourth voltage VSL4 to the word line of the target memory cell for the search operation, and execute the read operation for the target memory cell to obtain the second current. Based on the fourth voltage VSL2 being greater than the upper edge EG4, regardless of whether the data stored in the target memory cell is logic 0 or 1, the second current obtained by executing the read operation for the target memory cell may be the reference current value greater than 0.

Therefore, when the logic status of the searched data is logic 1 and the data stored in the target memory cell is logic 0, the controller may calculate that the difference between the second current and the first current approaches 0 (less than the preset current threshold), and may correspondingly generate the search result of un-match. In contrast, when the logic status of the searched data is logic 0 and the data stored in the target memory cell is logic 1, the controller may calculate that the difference between the second current and the first current is equal to the reference current value (greater than the preset current threshold), and correspondingly generate the search result of match.

It is worth mentioning that when the logic status of the searched data is don't care (also referred to as a wild card status), in the first stage, the controller may provide the first voltage VSL1 to the word line of the target memory cell, and perform the read operation for the target memory cell. Regardless of whether the data stored in the target memory cell is logic 0 or logic 1, the first voltage VSL1 is less than the threshold voltage of the target memory cell, so the first current approaching 0 may be obtained by performing the read operation for the target memory cell. In addition, in the second stage, the controller may provide the fourth voltage VSL3 to the word line of the target memory cell, and perform the read operation for the target memory cell. Regardless of whether the data stored in the target memory cell is logic 0 or logic 1, the fourth voltage VSL3 is greater than the threshold voltage of the target memory cell, so the second current equal to the reference current value may be obtained by performing the read operation for the target memory cell. In this way, the difference between the second current and the first current may be greater than the preset current threshold, and the controller may correspondingly generate the search result of match.

In addition, when the data stored in the selected memory cell is invalid data, the first current obtained by the controller in the first stage and the second current obtained in the second stage are substantially equal (both approaching 0 or both equal to the reference current value). Therefore, the controller may generate the search result of un-match through calculating the difference between the second current and the first current.

Figure 3A:
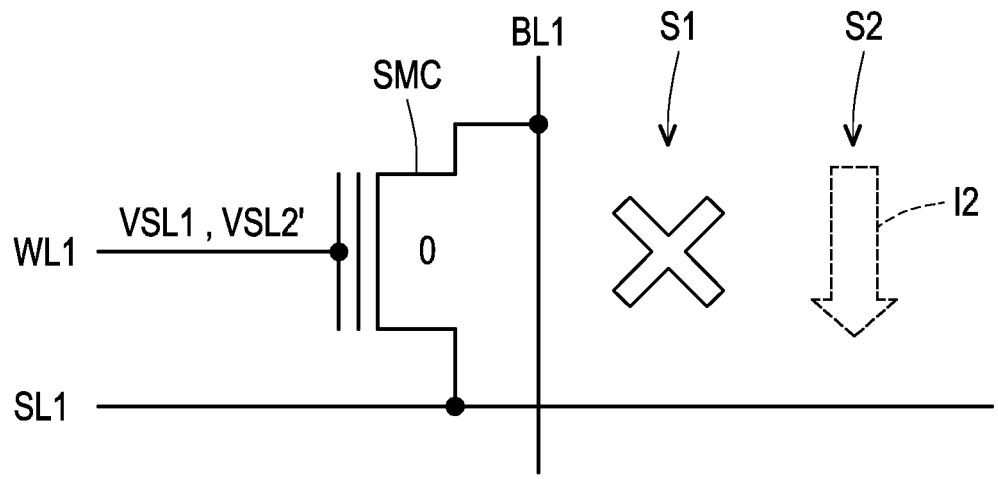
FIG. 3A to FIG. 3E are schematic diagrams of an implementation manner of an in-memory search operation for a single selected memory cell according to an embodiment of the disclosure.

Please refer to FIG. 3A to FIG. 3E below. FIG. 3A to FIG. 3E are schematic diagrams of an implementation manner of an in-memory search operation for a single selected memory cell according to an embodiment of the disclosure. In FIG. 3A, the logic status of the searched data is logic 0, and the data stored in a selected memory cell SMC is logic 0. When executing the search operation, a word line WL1 of the selected memory cell SMC may receive the first voltage VSL1 in a first stage S1. A source line SL1 of the selected memory cell SMC may receive a bias voltage, and may perform the read operation for the selected memory cell SMC. Based on the first voltage VSL1 being lower than the threshold voltage of the selected memory cell SMC, in the first stage S1, no current (the first current approaches 0) is generated on a bit line BL1 of the selected memory cell SMC.

In a second stage S2, the word line WL1 of the selected memory cell SMC may receive the third voltage VSL2', and perform the read operation of the selected memory cell SMC. Based on the second voltage VSL2' being higher than the threshold voltage of the selected memory cell SMC, a second current I2 equal to the reference current value may be generated on the bit line BL1 of the selected memory cell SMC.

In the implementation manner, through calculating the difference between the second current I2 and the first current (approaching 0), the selected memory cell SMC of FIG. 3A has the search result of match.

Figure 3B:
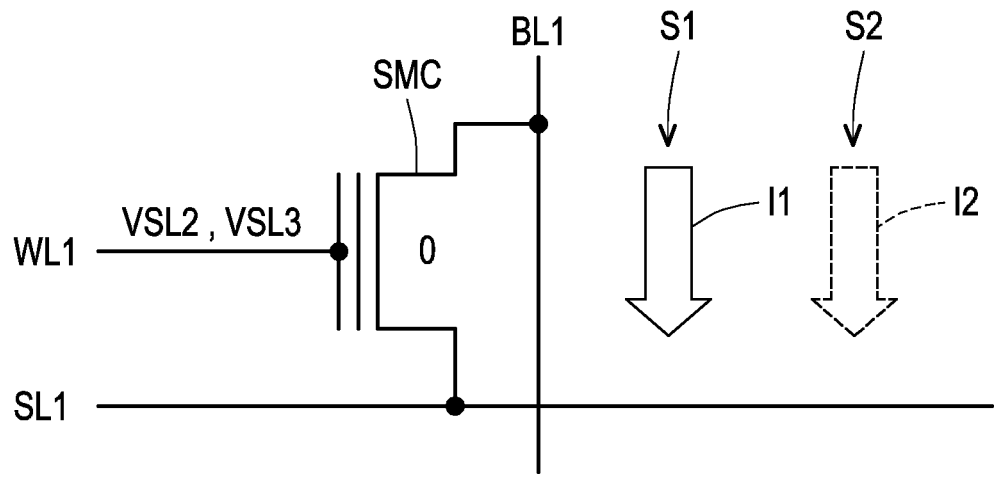

In FIG. 3B, the logic status of the searched data is logic 1, and the data stored in the selected memory cell SMC is logic 0. When executing the search operation, the word line WL1 of the selected memory cell SMC may receive the second voltage VSL2 in the first stage S1, and perform the read operation for the selected memory cell SMC. Based on the second voltage VSL2 being higher than the threshold voltage of the selected memory cell SMC, in the first stage S1, the first current I1 (equal to the reference current value) may be generated on the bit line BL1 of the selected memory cell SMC.

In the second stage S2, the word line WL1 of the selected memory cell SMC may receive the fourth voltage VSL3, and perform the read operation of the selected memory cell SMC. Based on the fourth voltage VSL3 being higher than the threshold voltage of the selected memory cell SMC, the second current I2 equal to the reference current value may be generated on the bit line BL1 of the selected memory cell SMC.

In the implementation manner, through calculating the difference between the second current I2 and the first current I1, the selected memory cell SMC of FIG. 3B has the search result of un-match.

Figure 3C:
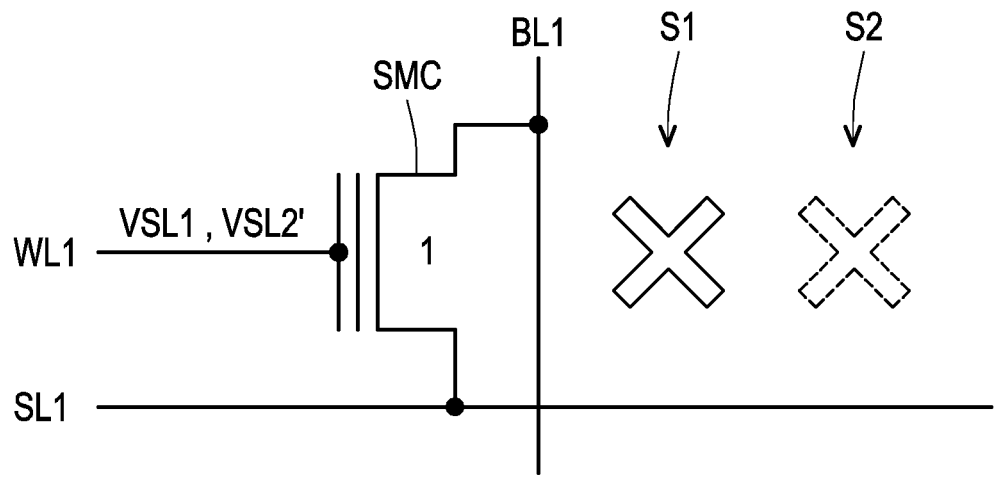

In FIG. 3C, the logic status of the searched data is logic 0, and the data stored in the selected memory cell SMC is logic 1. When executing the search operation, the word line WL1 of the selected memory cell SMC may receive the first voltage VSL1 in the first stage S1, and may perform the read operation for the selected memory cell SMC. Based on the first voltage VSL1 being lower than the threshold voltage of the selected memory cell SMC, in the first stage S1, no current (the first current approaches 0) is generated on the bit line BL1 of the selected memory cell SMC.

In the second stage S2, the word line WL1 of the selected memory cell SMC may receive the third voltage VSL2', and perform the read operation of the selected memory cell SMC. Since the second voltage VSL2' is lower than the threshold voltage of the selected memory cell SMC, no current (the second current approaches 0) is generated on the bit line BL1 of the selected memory cell SMC.

In the implementation manner, through calculating the difference between the second current and the first current, the selected memory cell SMC of FIG. 3C has the search result of un-match.

Figure 3D:
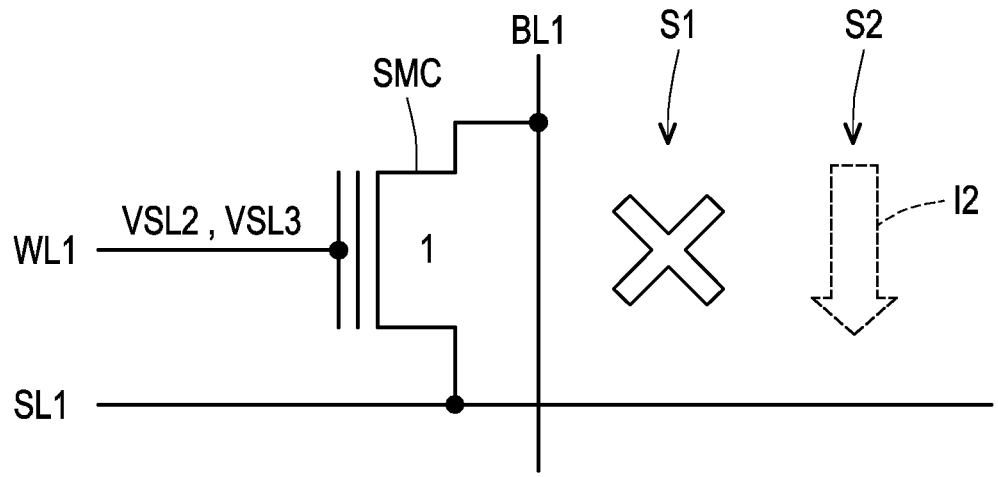

In FIG. 3D, the logic status of the searched data is logic 1, and the data stored in the selected memory cell SMC is logic 1. When executing the search operation, the word line WL1 of the selected memory cell SMC may receive the second voltage VSL2 in the first stage S1, and perform the read operation for the selected memory cell SMC. Based on the second voltage VSL2 being lower than the threshold voltage of the selected memory cell SMC, in the first stage S1, no current (the first current approaches 0) is generated on the bit line BL1 of the selected memory cell SMC.

In the second stage S2, the word line WL1 of the selected memory cell SMC may receive the fourth voltage VSL3, and perform the read operation of the selected memory cell SMC. Based on the fourth voltage VSL3 being higher than the threshold voltage of the selected memory cell SMC, the second current I2 equal to the reference current value may be generated on the bit line BL1 of the selected memory cell SMC.

In the implementation manner, through calculating the difference between the second current I2 and the first current (approaching 0), the selected memory cell SMC of FIG. 3D has the search result of match.

Figure 3E:
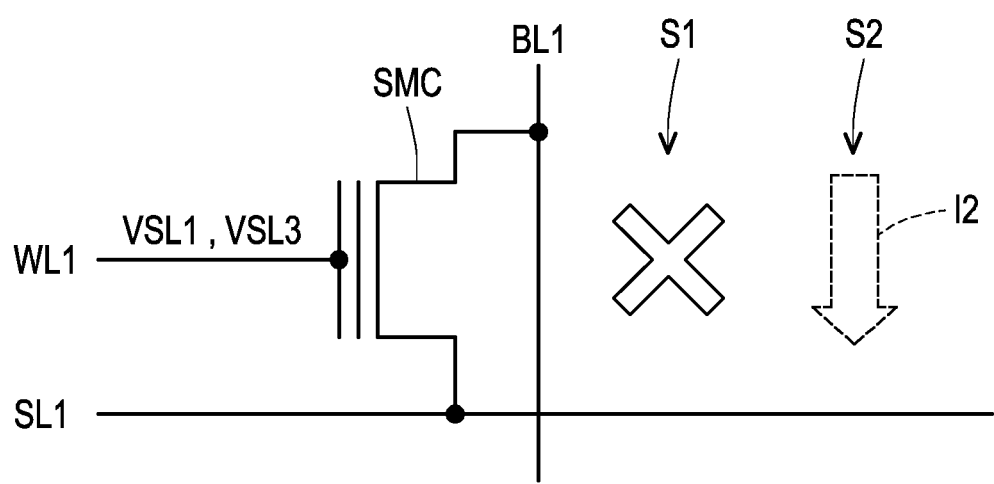

In FIG. 3E, the logic status of the searched data is don't care, and the data stored in the selected memory cell SMC may be logic 0 or logic 1. When executing the search operation, the word line WL1 of the selected memory cell SMC may receive the first voltage VSL1 in the first stage S1, and perform the read operation for the selected memory cell SMC. Based on the first voltage VSL1 being lower than the threshold voltage of the selected memory cell SMC, in the first stage S1, no current (the first current approaches 0) is generated on the bit line BL1 of the selected memory cell SMC.

In the second stage S2, the word line WL1 of the selected memory cell SMC may receive the fourth voltage VSL3, and perform the read operation of the selected memory cell SMC. Based on the fourth voltage VSL3 being higher than the threshold voltage of the selected memory cell SMC, the second current I2 equal to the reference current value may be generated on the bit line BL1 of the selected memory cell SMC.

In the implementation manner, through calculating the difference between the second current I2 and the first current (approaching 0), regardless of whether the data stored in the selected memory cell is logic 0 or logic 1, the selected memory cell SMC of FIG. 3E has the search result of match.

Figure 4:
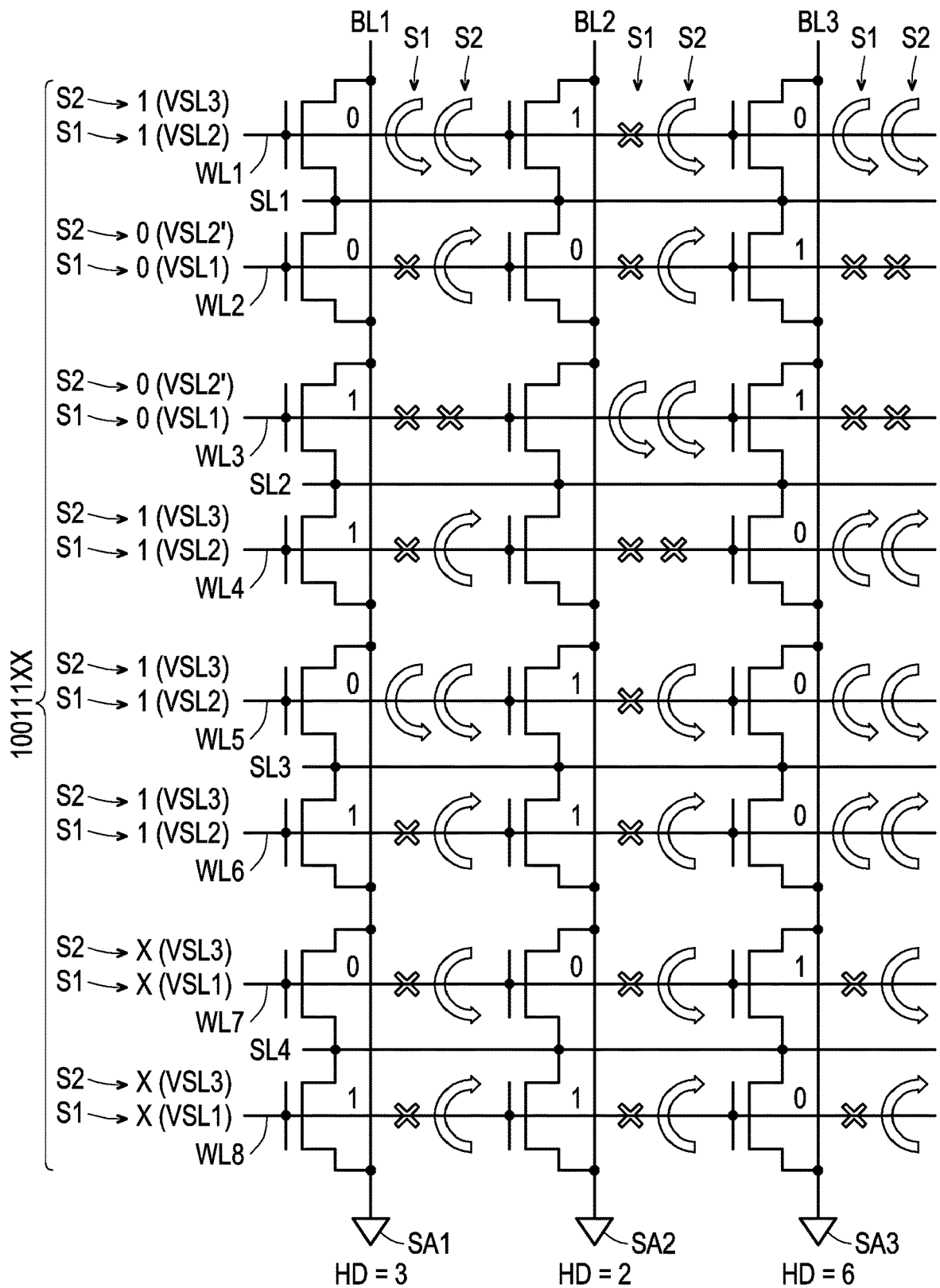
FIG. 4 is a schematic diagram of an implementation manner of a multiple-bit search operation of an in-memory search method according to an embodiment of the disclosure.

Please refer to FIG. 4. FIG. 4 is a schematic diagram of an implementation manner of a multiple-bit search operation of an in-memory search method according to an embodiment of the disclosure. In the implementation manner, a memory cell array 400 is a NOR flash memory cell array. The memory cell array 400 has multiple bit lines BL1 to BL3, multiple source lines SL1 to SL4, and multiple word lines WL1 to WL8. In the memory cell array 400, each of the bit lines BL1 to BL3 has multiple memory cells respectively coupled to the word lines WL1 to WL8. The bit lines BL1 to BL3 are respectively coupled to sense amplifiers SA1 to SA3.

In the implementation manner, on the bit line BL1, data respectively stored in the memory cells respectively corresponding to the word lines WL1 to WL8 are logic 0, logic 0, logic 1, logic 1, logic 0, logic 1, logic 0, and logic 1. On the bit line BL2, data respectively stored in the memory cells respectively corresponding to the word lines WL1 to WL8 are logic 1, logic 0, invalid data, invalid data, logic 1, logic 1, logic 0, and logic 1. On the bit line BL3, data respectively stored in the memory cells respectively corresponding to the word lines WL1 to WL8 are logic 0, logic 1, logic 1, logic 0, logic 0, logic 0, logic 1, and logic 0. In the implementation manner, the in-memory search operation may be synchronously performed for the memory cells on the bit lines BL1 to BL3.

During the in-memory search operation, a relationship between the stored data of the memory cell, the search data and corresponding current generated by the memory cell can be show as table 1:

TABLE 1

|  | Search data = 0<br>S1: VSL1<br>S2: VSL2 | Search data = 1<br>S1: VSL2'<br>S2: VSL3 | Wild card<br>S1: VSL1<br>S2: VSL3 |
|---|---|---|---|
| Stored data = 0 | I2 − I1 = I | I2 − I1 = 0 | I2 − I1 = I |
| Stored data = 1 | I2 − I1 = 0 | I2 − I1 = I | I2 − I1 = I |
| Invalid data 1 | I2 − I1 = 0 | I2 − I1 = 0 | I2 − I1 = 0 |
| Invalid data 2 | I2 − I1 = 0 | I2 − I1 = 0 | I2 − I1 = 0 |

Wherein the invalid data 1 corresponds to the distribution curve 230 in FIG. 2, and the invalid data 2 corresponds to the distribution curve 240 in FIG. 2. I is an unit current value (greater than 0).

In the implementation manner, the searched data for the in-memory search operation has, for example, eight bits and the logic values are 100111XX, wherein X is don't care. 100111XX respectively correspond to the memory cells on the word lines WL1 to WL8. When executing the in-memory search operation, in the first stage S1, the second voltage VSL2, the first voltage VSL1, the first voltage VSL1, the second voltage VSL2, the second voltage VSL2, the second voltage VSL2, the first voltage VSL1, and the first voltage VSL1 may be respectively applied to the word lines WL1 to WL8, and the read operation is performed for the memory cells. In the read operation of the first stage S1, for the memory cells on the bit line BL1, the memory cells corresponding to the word lines WL1 and WL5 generate the first current equal to the reference current value, and the memory cells on the remaining word lines WL2 to WL4 and WL6 to WL8 generate the first current approaching 0; for the memory cells on the bit line BL2, the memory cell corresponding to the word line WL3 generates the first current equal to the reference current value, and the memory cells on the remaining word lines WL1, WL2, and WL4 to WL8 generate the first current approaching 0; and for the memory cells on the bit line BL3, the memory cells corresponding to the word lines WL1 and WL4 to WL6 generate the first current equal to the reference current value, and the memory cells on the remaining word lines WL2, WL3, WL7, and WL8 generate the first current approaching 0.

Next, in the second stage S2, the fourth voltage VSL3, the third voltage VSL2', the third voltage VSL2', the fourth voltage VSL3, the fourth voltage VSL3, the fourth voltage VSL3, the fourth voltage VSL3, and the fourth voltage VSL3 may be respectively applied to the word lines WL1 to WL8, and the read operation is performed for the memory cells. In the read operation of the second stage S2, for the memory cells on the bit line BL1, the memory cells corresponding to the word lines WL1, WL2, and WL4 to WL8 generate the second current equal to the reference current value, and the memory cell on the remaining word line WL3 generates the second current approaching 0; for the memory cells on the bit line BL2, the memory cells corresponding to the word lines WL1 to WL3 and WL5 to WL8 generate the second current equal to the reference current value, and the memory cell on the remaining word line WL4 generates the second current approaching 0; and for the memory cells on the bit line BL3, the memory cells corresponding to the word lines WL1 and WL4 to WL8 generate the second current equal to the reference current value, and the memory cells on the remaining word lines WL3 and WL4 generate the second current approaching 0.

The sense amplifiers SA1 to SA3 may subtract the sum of the first current generated in the first stage S1 from the sum of the second current generated in the second stage S2 to generate the difference respectively for the memory cells on the bit lines BL1 to BL3, so as to generate search results. In the implementation manner, the bit lines BL1 to BL3 having the relatively large difference may have a relatively high similarity with the searched data. In the implementation manner, the sense amplifier SA1 may sense that the difference on the bit line BL1 is 5 reference current values, and may generate similarity information HD=3 (8 bits of the searched data minus the multiple relationship 5 between the difference and the reference current value); the sense amplifier SA2 may sense that the difference on the bit line BL2 is 6 reference current values, and may generate similarity information HD=2; and the sense amplifier SA3 may sense that the difference on the bit line BL3 is 2 reference current values, and may generate similarity information HD=6. The memory cells on the bit line BL2 corresponding to the similarity information HD=2 with the lowest value has the highest similarity with the searched data, and the memory cells on the bit line BL3 corresponding to the similarity information HD=6 with the highest value has the lowest similarity with the searched data.

Figure 5:
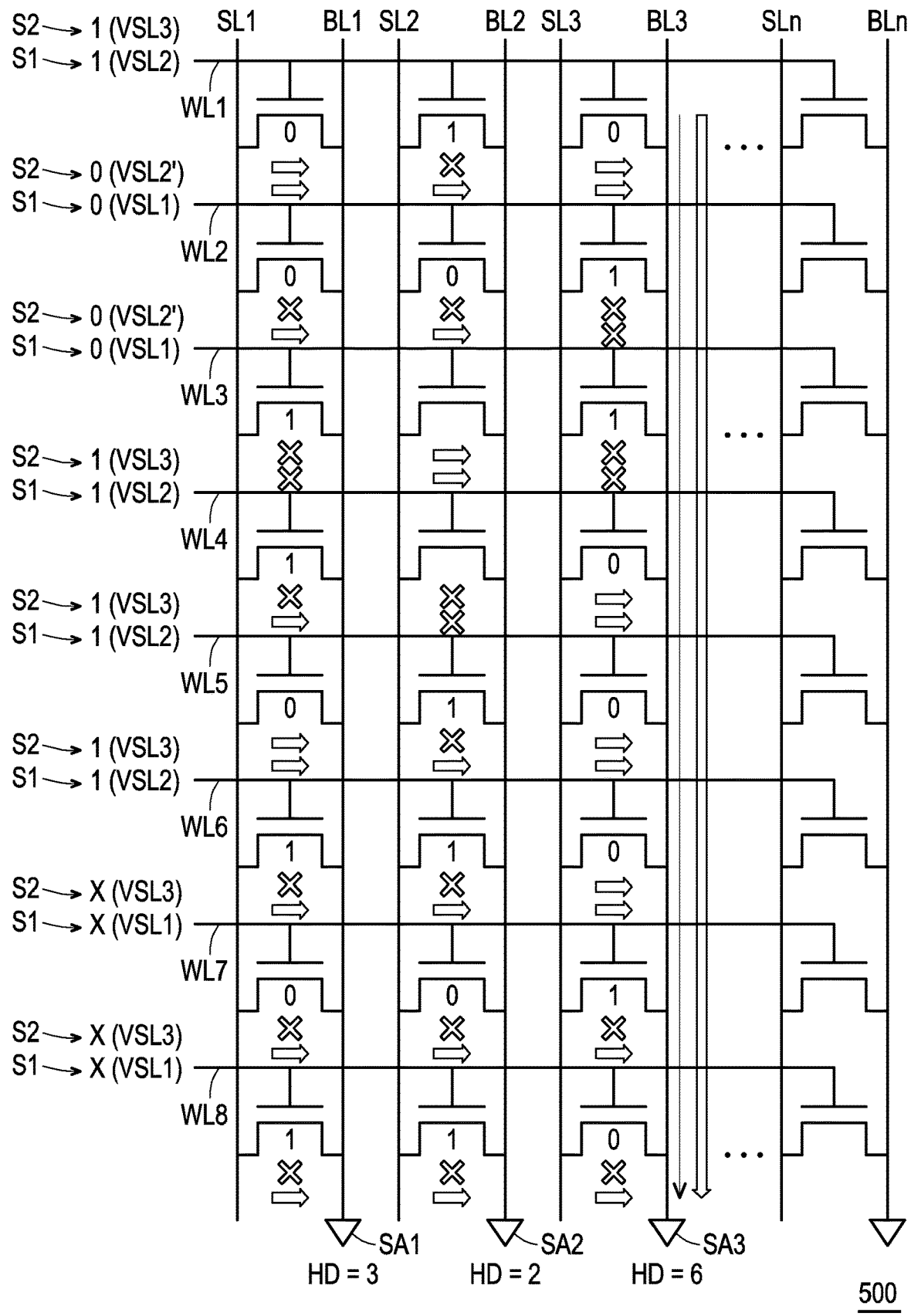
FIG. 5 is a schematic diagram of another implementation manner of a multiple-bit search operation of an in-memory search method according to an embodiment of the disclosure.

Please refer to FIG. 5 below. FIG. 5 is a schematic diagram of another implementation manner of a multiple-bit search operation of an in-memory search method according to an embodiment of the disclosure. In the implementation manner, a memory cell array 500 is an AND flash memory cell array. The memory cell array 500 has multiple bit lines BL1 to BL3, multiple source lines SL1 to SL4, and multiple word lines WL1 to WL8. In the memory cell array 500, each of the bit lines BL1 to BL3 has multiple memory cells respectively coupled to the word lines WL1 to WL8. The bit lines BL1 to BL3 are respectively coupled to sense amplifiers SA1 to SA3.

In the implementation manner, in the memory cell array 500, data stored in the memory cells on the bit lines BL1 to BL3 are the same as the data stored in the memory cells at the relative positions in the memory cell array 400. In the in-memory search operation, the logic values of the searched data are also 100111XX. When performing the in-memory search operation, in the first stage S1, the second voltage VSL2, the first voltage VSL1, the first voltage VSL1, the second voltage VSL2, the second voltage VSL2, the second voltage VSL2, the first voltage VSL1, and the first voltage VSL1 may be respectively applied to the word lines WL1 to WL8, and the read operation is performed for the memory cells. In the second stage S2, the fourth voltage VSL3, the third voltage VSL2', the third voltage VSL2', the fourth voltage VSL3, the fourth voltage VSL3, the fourth voltage VSL3, the fourth voltage VSL3, and the fourth voltage VSL3 may be respectively applied to the word lines WL1 to WL8, and the read operation is performed for the memory cells.

The sense amplifiers SA1 to SA3 respectively calculate multiple differences between the current on the bit lines BL1 to BL3 in the second stage S2 and the current on the bit lines BL1 to BL3 in the first stage S1, and respectively generate search results according to the differences and respectively generate similarity information HD. The similarity information HD generated by the sense amplifiers SA1 to SA3 are respectively equal to 3, 2, and 6.

Figure 6:
FIG. 6 is a schematic diagram of another implementation manner of a multiple-bit search operation of an in-memory search method according to an embodiment of the disclosure.

Please refer to FIG. 6 below. FIG. 6 is a schematic diagram of another implementation manner of a multiple-bit search operation of an in-memory search method according to an embodiment of the disclosure. In the implementation manner, a memory cell array has multiple memory cell groups C1 to C8. Each memory cell group has, for example, three memory cells corresponding to three different word lines. In the implementation manner, the memory cell groups C1 to C8 respectively store different data STD such as 000, 001, 010, 011, 100, 101, 110, and 111. In addition, searched data SHD is, for example, 010. When executing the in-memory search operation, the controller may execute the search operation for the memory cell groups C1 to C8 according to the time sequence.

During the in-memory search operation, a relationship between the stored data of the memory cell, the search data and corresponding current generated by the memory cell can be referred to the table 1 mentioned above.

For example, in a first time interval, the controller may generate a first voltage or a second voltage corresponding to a first stage according to the searched data SHD to be provided to a word line of the memory cell group C1, and execute a read operation on the memory cell group C1 to obtain multiple first current Isp1. In the implementation manner, the first current Isp1 is equal to 1 reference current value I. The controller may also generate a third voltage or a fourth voltage corresponding to a second stage according to the searched data SHD to be provided to the word line of the memory cell group C1, and execute the read operation on the memory cell group C1 to obtain multiple second current Isp2. In the implementation manner, the second current Isp2 is equal to 3 reference current values I. Through calculating the difference (=2I) between the second current Isp2 and the first current Isp1, the controller may generate similarity information HD=1.

Then, in a second time interval, the controller may execute the search operation for the memory cell group C2. In the two-stage read operation, through calculating the difference (=1I) between the second current Isp2 and the first current Isp1, the controller may generate similarity information HD=2.

By analogy, the controller may continue to execute the search operation of the memory cell groups C3 to C8, and the details will not be repeated here.

In the embodiment, in the search operation for the memory cell group C3, the lowest similarity information HD=0 may be obtained. In other words, the memory cell group C3 has the greatest similarity with the searched data SHD. The controller may stop the in-memory search operation to save time or the controller may also continue to perform the search operation of the remaining memory cell groups C4 to C8, and there is no specific limitation.

It is worth mentioning that in the implementation manner of the disclosure, the sense amplifier corresponding to the bit line may temporarily store the current value obtained in the first stage in a page buffer. In the second stage, the sense amplifier may subtract the obtained current value from the current value temporarily stored in the page buffer to generate the search result.

In addition, the controller may calculate the similarity information HD according to a subtraction result of the current generated on the sense amplifier.

Figure 7:
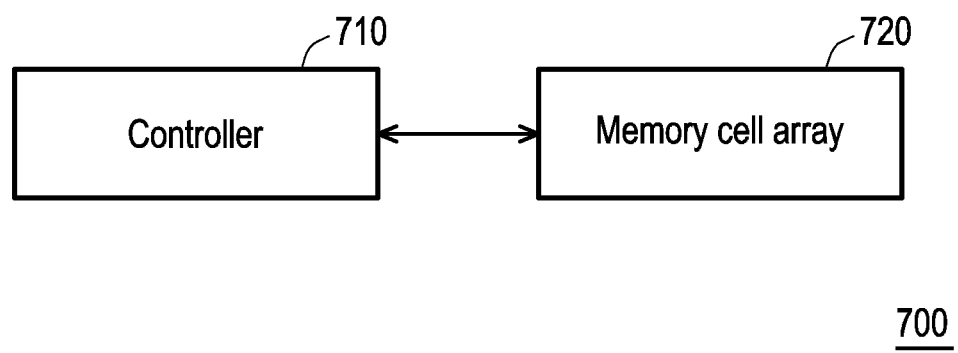
FIG. 7 is a schematic diagram of a memory device according to an embodiment of the disclosure.

Please refer to FIG. 7. FIG. 7 is a schematic diagram of a memory device according to an embodiment of the disclosure. A memory device 700 includes a controller 710 and a memory cell array 720. The controller 710 and the memory cell array 720 are coupled to each other. The memory cell array 720 may be a two-dimensional or three-dimensional memory cell array. For example, the memory cell array 720 may be a NOR or AND flash memory cell array. The memory cell array 720 includes multiple memory cells. The memory cell may be a floating gate memory cell, a split gate memory cell, a silicon nitride memory cell, a floating point memory cell, or a ferroelectric gate field effect transistor memory cell, and there is no specific limitation.

In the embodiment, the controller 710 may be implemented by a digital circuit or any processing unit with computing power. The controller 710 may be implemented by a memory controller that is well known to persons skilled in the art and may execute memory read and write operations, and there is no specific limitation.

The details of the in-memory search operation executed in the memory device 700 have been described in detail in the foregoing embodiments and implementation manners, and will not be repeated below.

In summary, the memory device of the disclosure executes the search operation for the data stored in the memory cells through the two-stage in-memory search method. In this way, the in-memory search operation can be effectively and correctly completed without a reference memory cell. In this way, the circuit area of the memory device can be effectively reduced, the production cost can be reduced, and the working efficiency of the associated system can be improved.

What is claimed is:

1. An in-memory search method, comprising:
providing, in a first stage, a first voltage or a second voltage to a word line of at least one target memory cell according to a logic status of searched data, and reading a first current;
providing, in a second stage, a third voltage or a fourth voltage to the word line of the at least one target memory cell according to the logic status of the searched data, and reading a second current; and
obtaining a search result according to a difference between the first current and the second current, wherein the first voltage is less than the third voltage, the third voltage is less than or equal to the second voltage, and the second voltage is less than the fourth voltage.

2. The in-memory search method according to claim 1, wherein a threshold voltage of a plurality of first memory cells storing logic value 0 is between a first threshold voltage and a second threshold voltage, a threshold voltage of a plurality of second memory cells storing logic value 1 is between a third threshold voltage and a fourth threshold voltage, and the first threshold voltage<the second threshold voltage<the third threshold voltage<the fourth threshold voltage, wherein the first voltage is less than the first threshold voltage, the third voltage and the second voltage are between the second threshold voltage and the third threshold voltage, and the fourth voltage is greater than the fourth threshold voltage.

3. The in-memory search method according to claim 1, wherein when a number of the at least one target memory cell is 1 and a logic value of the searched data is logic value 0, the in-memory search method comprises:
providing, in the first stage, the first voltage to the word line of the at least one target memory cell, and reading the first current;
providing, in the second stage, the third voltage to the word line of the at least one target memory cell, and reading the second current; and
generating the search result of match when the difference between the second current and the first current is greater than a preset current threshold.

4. The in-memory search method according to claim 1, wherein when a number of the at least one target memory cell is 1 and a logic value of the searched data is logic value 1, the in-memory search method comprises:

providing, in the first stage, the second voltage to the word line of the at least one target memory cell, and reading the first current;

providing, in the second stage, the fourth voltage to the word line of the at least one target memory cell, and reading the second current; and generating the search result of match when the difference between the second current and the first current is substantially equal to the preset current threshold.

5. The in-memory search method according to claim 1, wherein when a number of the at least one target memory cell is 1 and the searched data is don't care, the in-memory search method comprises:

providing, in the first stage, the first voltage to the word line of the at least one target memory cell, and reading the first current;

providing, in the second stage, the second voltage to the word line of the at least one target memory cell, and reading the second current; and generating the search result of match when the difference between the second current and the first current is substantially equal to the preset current threshold.

6. The in-memory search method according to claim 1, wherein when a threshold voltage of the at least one target memory cell is greater than the fourth voltage or less than the first voltage, the search result is un-match.

7. The in-memory search method according to claim 1, wherein when a number of the at least one target memory cell is greater than 1, the in-memory search method comprises:

providing, in the first stage, the first voltage to a plurality of word lines of the target memory cells, and reading the first current;

providing, in the second stage, the second voltage to the word lines of the target memory cells, and reading the second current; and generating the search result according to the difference between the second current and the first current, wherein the search result indicates a similarity between the searched data and data stored in the target memory cells.

8. A memory device, comprising:

a memory cell array; and a controller, coupled with the memory cell array and used to:

provide, in a first stage, a first voltage or a second voltage to a word line of at least one target memory cell according to a logic status of searched data, and read a first current;

provide, in a second stage, a third voltage or a fourth voltage to the word line of the at least one target memory cell according to the logic status of the searched data, and read a second current;

obtain a search result according to a difference between the first current and the second current, wherein the first voltage is less than the third voltage, the third voltage is less than or equal to the second voltage, and the second voltage is less than the fourth voltage.

9. The memory device according to claim 8, wherein a threshold voltage of a plurality of first memory cells storing logic value 0 is between a first threshold voltage and a second threshold voltage, a threshold voltage of a plurality of second memory cells storing logic value 1 is between a third threshold voltage and a fourth threshold voltage, and the first threshold voltage<the second threshold voltage<the third threshold voltage<the fourth threshold voltage, wherein the first voltage is less than the first threshold voltage, the third voltage and the second voltage are between the second threshold voltage and the third threshold voltage, and the fourth voltage is greater than the fourth threshold voltage.

10. The memory device according to claim 8, wherein when a number of the at least one target memory cell is 1 and a logic value of the searched data is logic value 0, the controller is used to:

provide, in the first stage, the first voltage to the word line of the at least one target memory cell, and read the first current;

provide, in the second stage, the third voltage to the word line of the at least one target memory cell, and read the second current; and generate the search result of match when the difference between the second current and the first current is substantially equal to the preset current threshold.

11. The memory device according to claim 8, wherein when a number of the at least one target memory cell is 1 and a logic value of the searched data is logic value 1, the controller is used to:

provide, in the first stage, the second voltage to the word line of the at least one target memory cell, and read the first current;

provide, in the second stage, the fourth voltage to the word line of the at least one target memory cell, and read the second current; and generate the search result of match when the difference between the second current and the first current is substantially equal to the preset current threshold.

12. The memory device according to claim 8, wherein when a number of the at least one target memory cell is 1 and the searched data is don't care, the controller is used to:

provide, in the first stage, the first voltage to the word line of the at least one target memory cell, and read the first current;

provide, in the second stage, the second voltage to the word line of the at least one target memory cell, and read the second current; and generate the search result of match when the difference between the second current and the first current is substantially equal to the preset current threshold.

13. The memory device according to claim 8, wherein when a threshold voltage of the at least one target memory cell is greater than the fourth voltage or less than the first voltage, the search result generated by the controller is un-match.

14. The memory device according to claim 8, wherein when a number of the at least one target memory cell is greater than 1, the controller is used to:

provide, in the first stage, the first voltage to a plurality of word lines of the target memory cells, and read the first current;

provide, in the second stage, the second voltage to the word lines of the target memory cells, and read the second current; and generate the search result according to the difference between the second current and the first current, wherein the search result indicates a similarity between the searched data and data stored in the target memory cells.

15. The memory device according to claim 8, wherein the memory cell array is a two-dimensional or three-dimensional memory cell array.

16. The memory device according to claim 8, wherein the memory cell array is a NOR or AND flash memory cell array.

17. The memory device according to claim 8, wherein a memory cell in the memory cell array is a floating gate memory cell, a split gate memory cell, a silicon nitride memory cell, a floating point memory cell, or a ferroelectric gate field effect transistor memory cell.

* * * * *